(12) United States Patent
Florian et al.

(10) Patent No.: US 8,956,485 B2
(45) Date of Patent: Feb. 17, 2015

(54) ELECTRIC FUNCTIONAL UNIT AND METHOD FOR THE PRODUCTION THEREOF

(75) Inventors: Heinz Florian, Bad Gams (AT); Wolfgang Vogl, Vienna (AT); Igor Kartashev, Deutschlandsberg (AT)

(73) Assignee: EPCOS AG, Munich (DE)

( * ) Notice: Subject to any disclaimer, the term of this patent is extended or adjusted under 35 U.S.C. 154(b) by 144 days.

(21) Appl. No.: 12/759,155

(22) Filed: Apr. 13, 2010

(65) Prior Publication Data

US 2010/0193107 A1  Aug. 5, 2010

Related U.S. Application Data

(62) Division of application No. 11/587,505, filed as application No. PCT/DE2005/000767 on Apr. 26, 2005, now Pat. No. 7,723,897.

(30) Foreign Application Priority Data

Apr. 26, 2004  (DE) .......................... 10 2004 020 329

(51) Int. Cl.
 *C03B 29/00* (2006.01)
 *H01L 41/273* (2013.01)
 *H01L 41/083* (2006.01)
 *H01L 41/047* (2006.01)
 *H01L 41/00* (2013.01)

(52) U.S. Cl.
 CPC ............ *H01L 41/273* (2013.01); *H01L 41/083* (2013.01); *H01L 41/0474* (2013.01)
 USPC ....................... 156/89.12; 156/89.11; 310/311

(58) Field of Classification Search
 USPC ............ 156/89.11, 89.12; 439/245, 865, 862, 439/857, 856, 854, 852, 851, 841, 840, 825, 439/823, 817, 816, 729, 700
 See application file for complete search history.

(56) References Cited

U.S. PATENT DOCUMENTS

| | | | | |
|---|---|---|---|---|
| 3,193,788 A | * | 7/1965 | Brown | 439/46 |
| 3,218,606 A | * | 11/1965 | Schultz | 439/844 |
| 3,281,760 A | * | 10/1966 | Oshima et al. | 439/686 |
| 3,394,341 A | * | 7/1968 | Venn | 439/593 |
| 3,548,347 A | | 12/1970 | Miller et al. | |
| 3,792,412 A | * | 2/1974 | Madden | 439/82 |
| 3,999,004 A | * | 12/1976 | Chirino et al. | 174/257 |
| 4,019,073 A | | 4/1977 | Vishnevsky et al. | |
| 4,400,641 A | | 8/1983 | Vishnevsky et al. | |

(Continued)

FOREIGN PATENT DOCUMENTS

DE  198 35 644  8/1998
DE  19981035644  8/1998

(Continued)

OTHER PUBLICATIONS

Action & Response History in U.S. Appl. No. 11/587,505.

(Continued)

*Primary Examiner* — Alex Efta
(74) *Attorney, Agent, or Firm* — Fish & Richardson P.C.

(57) ABSTRACT

A method of producing an electrical component includes forming a stack of ceramic green films, where the stack has a hole that is accessible from external to the stack, inserting a cover into the hole, and sintering the stack together with the cover. The method may also include boring the hole through the stack of ceramic green films.

4 Claims, 5 Drawing Sheets

(56) References Cited

U.S. PATENT DOCUMENTS

| | | | |
|---|---|---|---|
| 4,453,103 A | | 6/1984 | Vishnevsky et al. |
| 4,471,256 A | | 9/1984 | Igashira et al. |
| 4,819,128 A | | 4/1989 | Florian et al. |
| 5,083,944 A | * | 1/1992 | Self, Jr. .................. 439/595 |
| 5,151,660 A | * | 9/1992 | Powers et al. .................. 324/689 |
| 5,154,621 A | * | 10/1992 | Legrady .................. 439/82 |
| 5,272,283 A | * | 12/1993 | Kuzma .................. 174/262 |
| 5,333,095 A | | 7/1994 | Stevenson et al. |
| 5,603,147 A | * | 2/1997 | Bischoff et al. .................. 29/25.42 |
| 5,751,539 A | * | 5/1998 | Stevenson et al. .................. 361/302 |
| 6,278,222 B1 | | 8/2001 | Katsuragi et al. |
| 6,307,306 B1 | | 10/2001 | Bast et al. |
| 6,471,555 B2 | | 10/2002 | Creze |
| 6,522,052 B2 | | 2/2003 | Kihara et al. |
| 6,567,259 B2 | * | 5/2003 | Stevenson et al. .................. 361/302 |
| 6,794,800 B1 | | 9/2004 | Heinz |
| 6,914,392 B2 | | 7/2005 | Hanisch et al. |
| 6,940,213 B1 | | 9/2005 | Heinz |
| 7,208,862 B2 | | 4/2007 | Florian et al. |
| 7,224,813 B2 | | 5/2007 | Hooley et al. |
| 7,304,414 B2 | | 12/2007 | Florian et al. |
| 7,343,137 B2 | | 3/2008 | Block et al. |
| 7,408,292 B2 | | 8/2008 | Feltz et al. |
| 7,411,340 B2 | | 8/2008 | Florian et al. |
| 7,432,639 B2 | | 10/2008 | Florian et al. |
| 7,477,002 B2 | | 1/2009 | Florian et al. |
| 7,492,565 B2 | | 2/2009 | Block et al. |
| 7,723,897 B2 | | 5/2010 | Florian et al. |
| 2002/0043901 A1 | | 4/2002 | Kihara et al. |
| 2002/0098333 A1 | | 7/2002 | Feltz et al. |
| 2003/0000079 A1 | * | 1/2003 | Harada et al. .................. 29/830 |
| 2004/0051423 A1 | | 3/2004 | Florian et al. |
| 2004/0051480 A1 | | 3/2004 | Hanisch et al. |
| 2004/0257740 A1 | | 12/2004 | Block et al. |
| 2004/0264095 A1 | | 12/2004 | Block et al. |
| 2005/0035686 A1 | | 2/2005 | Florian et al. |
| 2005/0059358 A1 | | 3/2005 | Block et al. |
| 2005/0059371 A1 | | 3/2005 | Block et al. |
| 2005/0236933 A1 | | 10/2005 | Florian et al. |
| 2006/0119228 A1 | | 6/2006 | Florian et al. |
| 2006/0251911 A1 | | 11/2006 | Feltz et al. |
| 2007/0101976 A1 | | 5/2007 | Seidl et al. |
| 2007/0158608 A1 | | 7/2007 | Feltz et al. |
| 2007/0194667 A1 | | 8/2007 | Florian et al. |
| 2007/0267948 A1 | | 11/2007 | Feltz et al. |
| 2007/0278906 A1 | | 12/2007 | Florian et al. |
| 2008/0030105 A1 | | 2/2008 | Florian et al. |
| 2008/0042522 A1 | | 2/2008 | Althoff et al. |
| 2008/0057798 A1 | | 3/2008 | Florian et al. |
| 2008/0224570 A1 | | 9/2008 | Florian et al. |
| 2009/0085436 A1 | | 4/2009 | Kartashev et al. |

FOREIGN PATENT DOCUMENTS

| | | |
|---|---|---|
| DE | 199 30 585 | 7/1999 |
| DE | 199 09 482 | 9/2000 |
| DE | 199 17 728 | 10/2000 |
| DE | 100 17 975 | 10/2001 |
| DE | 102 36 986 | 2/2004 |
| JP | 58-218183 | 12/1983 |
| JP | 03151677 | 6/1991 |
| JP | 08-172782 | 7/1996 |
| JP | 2000-077737 | 3/2000 |
| JP | 2000-83388 | 3/2000 |
| JP | 2000-400202 | 12/2000 |
| JP | 2002-261339 | 9/2002 |
| JP | 2003-518752 | 6/2003 |
| WO | WO01/47041 | 6/2001 |
| WO | WO03/094252 | 11/2003 |

OTHER PUBLICATIONS

English Translation of International Search Report and Written Opinion in Application No. PCT/DE2005/000767, dated Oct. 27, 2005.
International Search Report and Written Opinion in Application No. PCT/DE2005/000767, dated Oct. 27, 2005.
English Translation of International Preliminary Report on Patentability in Application No. PCT/DE2005/000767, dated Nov. 1, 2006.
English translation for examination report from JP Application No. 2007-509875 dated Aug. 19, 2010.
English Translation of the Notification of Reasons for Refusal in Japanese Application No. 2007-509875, dated Mar. 30, 2011.

* cited by examiner

ELECTRIC FUNCTIONAL UNIT AND METHOD FOR THE PRODUCTION THEREOF

CROSS-REFERENCE TO RELATED APPLICATION

This patent application is a divisional of, and claims priority to, U.S. patent application Ser. No. 11/587,505, which was filed on Dec. 19, 2006 now U.S. Pat. No. 7,723,897. The contents of U.S. patent application Ser. No. 11/587,505 are hereby incorporated by reference into this patent application as if set forth herein in full. This patent application also claims priority to PCT Application No. PCT/DE2005/000767 filed on Apr. 26, 2005 and to German Application No. 102004020329.6 filed on Apr. 24, 2004. The contents of PCT Application No. PCT/DE2005/000767 and German Application No. 102004020329.6 are hereby incorporated by reference into this patent application as if set forth herein in full.

TECHNICAL FIELD

This patent application describes an electrical component with a body which is formed from a stack of ceramic layers.

BACKGROUND

A piezoelectric actuator includes a base body that contains a stack of piezoelectric layers and electrode layers among the piezoelectric layers. The piezoelectric layers contain ceramic material and are sintered with the electrode layers. Such a piezoelectric actuator is described in WO03/094252A2. Perpendicular to the electrode layers is a hole running through the base body, into which a rod is inserted.

An electrical component is known from JP03151677A, which describes internal electrodes of a piezoelectric actuator contacted by an elastic element. The elastic element can follow the movement of the piezoelectric actuator during operation.

SUMMARY

An electrical component with a body is described herein. The body may be formed from a stack of ceramic layers on top of one another.

The ceramic layers can be layers with piezoelectric properties. In this case, the electrical component can be a piezoelectric actuator. Electrode layers, which are contacted outwardly, are arranged between the ceramic layers, so that a voltage can be applied to a capacitor whose dielectric is filled with a piezoelectric material.

A cavity can be provided in the body and is accessible from the outside. The cavity has a wall, on which a contact surface can be placed. The contact surface may be connected with an electrical functional element in an electrically conductive manner. Such an electrical functional element can be an electrode layer of a multilayer piezoelectric actuator.

A contact device may be provided that is suitable for contacting the contact surface. The contact device can also be connected from outside the body. For example, contact wires can be soldered from the outside of the contact device or fixed, in an electrically conductive manner, in some other way.

Furthermore, provision is made so that the contact device comprises a contact spring that exerts an elastic force on the contact surface.

Electrical contact between the contact device and the contact surface is mediated by the contact spring.

As described herein, contacting of a contact surface takes place in the interior of the body. In this way, the contacting of disturbing external influences, such as mechanical influences, is decoupled. Moreover, integrating the contact device into the interior of the body saves space.

In contrast to a contacting from the outside, room remains on the outside of the body for other necessary elements, such as a cooling device.

Furthermore, since contacting is effected via a contact spring, it is insensitive to mechanical influences that can occur, for example, during contraction or expansion of a piezoelectric actuator in the longitudinal direction.

The type of contacting described herein can be used advantageously with movable components, such as piezoelectric stacks.

It is particularly advantageous if the contact device is located in the cavity of the body and is movable inside the body. In this way, the contact device can be displaced to react to mechanical external or internal influences. For instance, with a decreasing electrical contact after many operating hours of the electrical component, a simple servicing of the electrical contact can be performed by taking out the contact device.

The contact device may be inserted into the cavity. This design of the electrical component has the advantage that the steps for production of the body and the steps for production of the electrical contact can be separated from one another with regard to time, and also with regard to place. In this way materials can be used for the electrical contact device which need not be compatible with the processing steps used for the production of the body or the electrical component.

It is also advantageous if the contact device can be inserted. The contact device need not necessarily be movable. Rather, the contact device can be inserted once and then, for example, remain in the body via a locking device. It need not always be displaceable in the body or in the cavity.

One or more contact springs may be provided that to effect electrical contact with the contact surface and, at the same time, make it possible to connect or contact the contact device electrically from outside the body.

In one embodiment of the component, provision is made so that the contact surface is connected with an electrically conductive functional element located in the interior of the body. With the aid of such an embodiment, it is possible to contact an electrical functional element in the interior of the body from the outside via the contact device.

In another embodiment of the component, provision is made so that the contact surface is formed by a cover which at least partially covers the wall of the cavity. The entire wall of the cavity need not necessarily be covered. A covering of the cavity wall may be provided at certain places provided for use in making electrical contact. In another embodiment of the component, the entire wall of the cavity can also be covered with a cover. The cover may be made entirely of an electrically conductive material, but this is not necessary. It is sufficient if the cover is electrically conductive at places provided for the purpose, so as to be able to effect a contact for the contact device.

In another embodiment of the component, the contact device has a connecting part projecting from the cavity. This connecting part is connected with the contact spring in an electrically conductive manner. The connecting part can be further contacted from the outside, for example, by clamping or soldering on an electrically conductive wire. Because the connecting part projects outwards, a functional separation can be obtained between an elastic electrical contact and outward contactability. This has the advantage that each of the two functions can be enhanced with regard to the form of the element fulfilling the function to be selected, and also with regard to the materials to be selected.

However, this does not mean that the two functions must necessarily be implemented in separate elements. There are embodiments of the component in which the contact spring is simultaneously used for the external contacting.

In one embodiment of the component, the cover is formed by a metal sheet. This metal sheet can have the form of a tube and thereby cover the wall of a hole-shaped cavity in the body.

In another embodiment of the component, the cover is formed by a metal-containing baking paste. This baking paste can be spread on the wall of the hole, and subsequently be baked on the surface of the wall at a suitable temperature.

In another embodiment of the component, a cover is provided in the form of a conductive adhesive. The conductive adhesive can be applied to the wall of the cavity via a brush, for example.

In another embodiment of the component, provision is made so that the cover is formed by a wire coiled in the shape of a screw. It can be a round wire or also a wire with a rectangular cross section.

In an embodiment of the component, provision is made so that the contact device is formed by an elastic tube slit in the longitudinal direction. This embodiment has the advantage that the function of elastic contact with the contact surface and the function of capability for contact from the outside can be obtained with a single element—namely, with the elastic tube. In this way, the component has a simple and compact structure.

In another embodiment of the component, provision is made so that a separate connecting part is part of the contact device. This connecting part can be a metal rod.

The connecting part can, however, also be formed by wires twisted together with one another.

In another embodiment of the component, a spring part is provided that has the form of a bent, elastic sheet.

In another embodiment, the spring part can be formed by a tube with a corrugated wall. An elastic force can be produced between the spring part and the contact surface by the undulating wall.

In another embodiment of the component, the spring part can be formed by the bristles of a tube brush. Metal or electrically conductive bristles can be used, which are affixed, for example, on wires twisted together with one another.

In another embodiment of the component, the spring part can have the form of a wire mesh.

In an embodiment of the component, a large number of electrical functional elements are provided. These functional elements may be formed in the shape of electrically conductive electrode layers that are placed between the ceramic layers.

Through such functional elements, it is possible to implement, for example, a piezoelectric actuator as an electrical component.

In another embodiment, it is possible to provide for the cover to be sintered into the cavity. In this way, a firm mechanical union may be formed between the body and the cover so that the risk of detachment of the cover is reduced during contraction or expansion movements of the body.

In another embodiment of the component, provision is made so that the component produces mechanical stresses during operation. These mechanical stresses can be contractions or expansions in a longitudinal direction.

In another embodiment of the component, the cavity is shaped as a hole running in the body. In this case, the cover can have the form of a tube that is adapted to the hole. The body of the component may be produced by joint sintering of several green ceramic films lying on top of one another. Through a suitable adaptation of the length of the tube and the external diameter of the tube, a solid sintering of the tube into the hole can be obtained.

In another embodiment, provision may be made so that the tube is held in the hole by forces resulting from sintering shrinkage, which are directed toward the interior of the hole.

The material of the tube may be the same as the material of the electrode layers. In this case, the material diversity can be reduced, and a particularly good electrically conductive binding of the tube to the electrode layers of the multilayer component can be obtained.

In another embodiment of the component, the tube can be a slit, porous, or perforated tube, or also a tube provided with dents.

A method is also described herein for the production of an electrical component. According to the method, a stack of green ceramic films is formed, which are over one another in the stack. Electrode layers are placed among the ceramic green films.

The stack thus formed has a hole.

A cover is introduced into the hole.

The cover can be inserted into the hole or also be pressed in.

Subsequently, the stack is sintered together with the cover.

In an embodiment of the method, a large number of green ceramic films is prepared that are provided with punched openings.

Subsequently, the green films are stacked on top of one another in such a way that the openings lie over one another so that they align. The hole in the body can then be formed by the openings which align.

In another variant of the method described herein, green ceramic films are stacked on top of one another. The green ceramic films, however, do not have openings. Subsequently, a hole is bored in the stack thus formed. The cover, e.g., a tube, can be inserted into this hole.

In another embodiment of the method, a tube is selected as the cover whose lateral dimension, measured transverse to the longitudinal direction of the tube, is such that the tube is held in the hole by shrinkage of the hole during the sintering of the green ceramic films.

The result of this is a good mechanical between the outside wall of the tube and the ceramic material, and a good electrical connection between the tube and the inside electrodes.

Below, an electrical component is explained in more detail with the aid of embodiments and corresponding figures.

DESCRIPTION OF THE DRAWINGS

In a schematic cross section, FIG. 13 shows, by way of example, an electrical component, wherein a large number of bristles are provided as contact springs.

In an oblique representation, FIG. 14 shows an electrical component with two cavities that are contacted by electrically conductive bristles.

DETAILED DESCRIPTION

Figure 1:
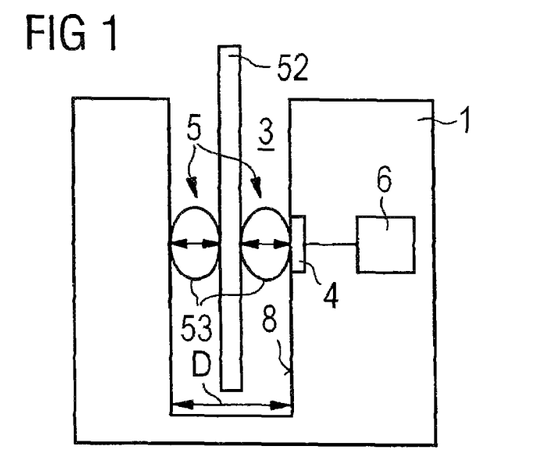
FIG. 1 shows, by way of example, a component in a schematic cross section.

FIG. 1 shows a body 1, which has a cavity 3. The cavity is accessible from the outside, and in the example of FIG. 1 is in the form of a hole or a blind hole. The cavity 3 is not limited to the hole form, but can have arbitrarily different shapes. The cavity 3 need not pass through the body 1.

In FIG. 1, an electrical contact surface 4 fits tightly against the surface of the wall 8 of the cavity 3. The contact surface 4 is connected in an electrically conductive manner with an electrical functional element 6. A contact device 5 is provided in order to be able to contact the functional element 6 from the outside. The contact device 5 includes a connecting part 52 that extends longitudinally into the cavity 3 and is accessible from the outside. The connecting part 52 projects from the cavity 3. Contact springs 53 are also a component of the contact device 5; they are pressed together in the interior of the cavity 3 and accordingly, exert forces on the connecting part 52 or on the wall 8 of the cavity 3, as shown by the two double arrows. The contact springs 53, therefore, exert pressure forces that act toward the outside from the interior of the contact springs 53. An electrical contact can be established between the contact surface 4 and the connecting part 52 by these pressure forces. The contact is effected on the one hand at a point where the contact spring 53 presses against the contact surface 4. Furthermore, the contact is effected at the point where the contact spring 53 is connected with the connecting part 52.

Figure 2:
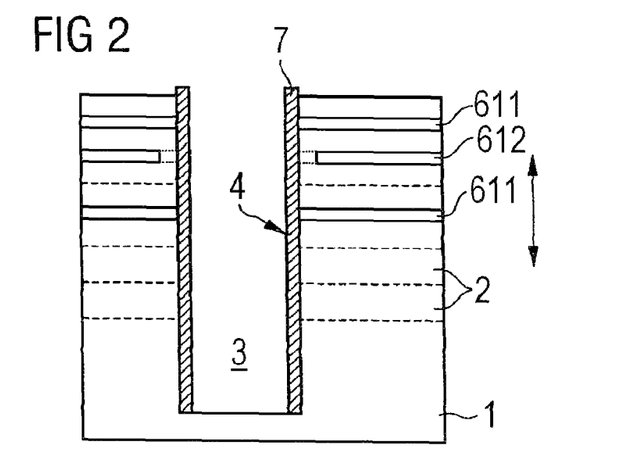
FIG. 2 shows an electrical component in a schematic cross section, wherein electrode layers are provided within the body.

FIG. 2 shows another embodiment of the electrical component. The body 1 is formed by a stack of ceramic layers 2 on top of one another. At some points, electrode layers 611 of a first type or electrode layers 612 of a second type are arranged among two ceramic layers 2. A piezoelectric actuator can be formed via such an arrangement. All electrode layers 611 of the first type are placed at a first potential. All electrode layers 612 of the second type are placed at a second potential. In this way, the piezoelectric layers 2 are exposed to an electric field, leading to an expansion of these layers and to an expansion of the body 1 in its longitudinal direction.

Contacting the electrode layers 611, 612 can be achieved via two cavities 3. This way of contacting is represented, in an exemplary way, in FIG. 2. A cavity 3, in the form of a hole, is provided in the longitudinal direction of the body 1. The wall 8 of the hole is provided with a cover 7, which can have the form of an electrically conductive metal tube. The inside surface of the cover 7 then forms the contact surface 4.

It is advantageous if the hole runs the entire length of the body 1 so that all electrode layers 611 of the first type can be contacted by a contact device.

The cover 7 can be sintered into the cavity 3. In this way, a good electrical contact is formed between the cover 7 and the electrode layers 611 of the first type. The electrode layers 612 of the second type are designed such that they are sufficiently distant from the cover 7 so that electrical contact, and consequently a short circuit, can be avoided between the two different electric poles. Moreover, good mechanical binding of the cover 7 to the ceramic layers 2, and consequently to the body 1, can be achieved by sintering the cover 7 into the cavity 3.

FIG. 2 would then have to be given a suitable contact device 5 in order to complete the contacting of the electrode layers 611.

The cover 7 can be constructed in the form of a tube, such as a copper tube. The copper tube can have an inside diameter of 1.2 mm. The copper tube has a length of approximately 30 mm, in accordance with the expansion of the body 1. If a larger number of ceramic layers 2 and accordingly, electrode layers 611, 612, are provided, e.g., in order to obtain a particularly large deflection of the piezoelectric actuator, copper tubes with a length of 60 mm or even more are also usable. The material of the cover 7 may be selected such that it corresponds to the material of the electrode layers 611, 612. For example, copper or silver-palladium can also be used as materials for the electrode layers. Accordingly, the same materials can also be used for the cover 7.

In FIG. 2, movement of the actuator in its longitudinal direction is also effected by application of an electric voltage to the electrode layers. The actuator expands in the longitudinal direction with application of the voltage; upon removal of the voltage, the actuator contracts in the longitudinal direction.

Figure 2A:
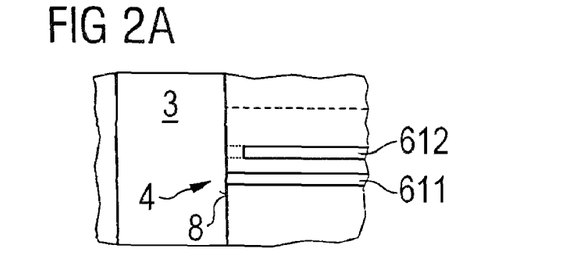
FIG. 2A shows the binding of inside electrodes to the inside of the hole.

FIG. 2A shows another variant for contacting the electrode layers 611. In this variant, no cover 7 is used. The electrode layers 611, however, extend to the wall 8 of the cavity 3. There they form a free surface, and consequently a contact surface 4. This contact surface can then be contacted by a suitable contact device, for example, in accordance with FIG. 1.

Figure 3:
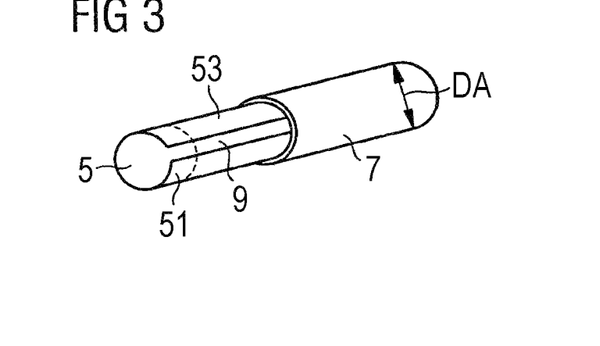
FIG. 3 shows a contact device and a corresponding cover.

FIG. 3 shows a contact device 5 in the form of a tube that is slit in the longitudinal direction. Such a tube can be suitably flexed so that upon insertion into the cover 7, which in turn has the form of a tube, it exerts a corresponding elastic force on the inside wall of the cover 7 that acts from the inside to the outside. In this respect, the slit tube forms the contact spring 53. Since the slit tube is not completely inserted into the cover 7 or into the tube forming the cover, a projection remains outside the cover 7, which can also remain outside a body 1, and which thus can form a connecting section 51 of the contact device 5.

The contact device 5 has a longitudinal slit 9 in FIG. 3.

In FIG. 3, a cover 7 in the form of a tube is also shown. The lateral dimension DA of the tube is likewise indicated. With a cylindrical tube, it corresponds to the outside diameter of the tube. This outside diameter can be selected with reference to the hole, in particular, with reference to the hole diameter D, as shown, for example, in FIG. 1, so that the cover 7 is maintained by the sintering forces during sintering into the cavity in the form of a hole. For example, a hole with a diameter of 1.5 mm can be formed in a green body made of green ceramic laminations on top of one another. In the selection of a tube with an outside diameter of 1.4 mm, care can be taken that after sintering the body, the tube is held firmly in the hole.

This is effected by sintering shrinkage, which acts in the direction of the middle of the cavity.

Figure 4:
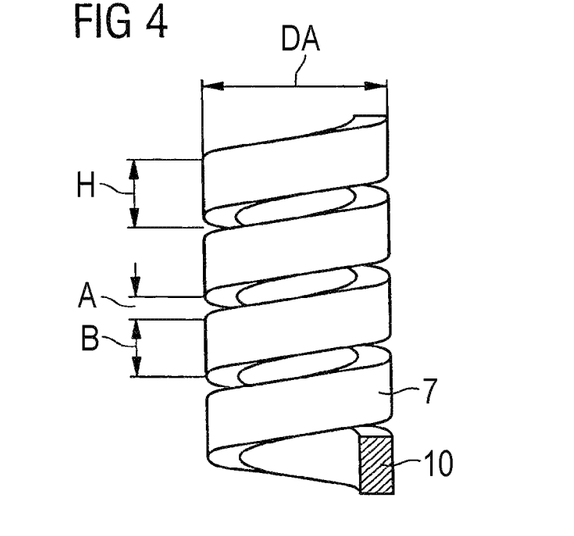
FIG. 4 shows another exemplary cover in an oblique representation.

FIG. 4 shows a cover 7 in the form of a screw-like, coiled wire. The wire is a flat wire 10.

The coil represented in FIG. 4 is characterized by the lateral expansion DA of cover 7, by the pitch H of the coil, by the opening A of the coil, and by the width B of the coil, where in the case of a round wire the width B corresponds to the diameter of the round wire.

The following applies:

$$B+A=H.$$

In the production of a body 1 in the form of a stack of green ceramic films, lying on top of one another. A relative longitudinal change L:L0=0.84 can be obtained during sintering in the longitudinal direction—that is, in the stack direction, for example. Here, L stands for the length of the stack after sintering and L0, for the length of the stack before sintering. By a suitable selection of the parameters of the coil, it is possible to achieve closing of the coil openings during sintering, and at the same time, not have the coil offer any resistance to the shrinkage since it yields to the sintering shrinkage by closing the openings. A suitable selection of the coil parameters would be found by establishing that: B/H=L/L0, which is equivalent to:

$$B/(A+B)=L/L0.$$

Figure 5:
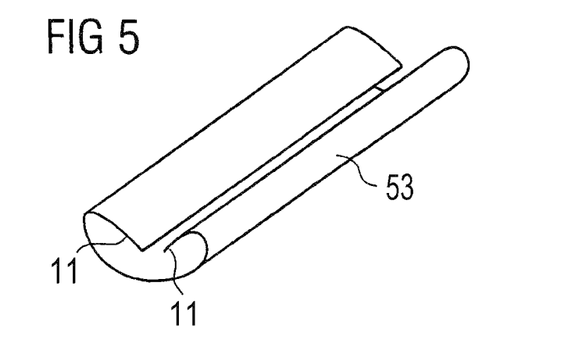
FIG. 5 shows an oblique representation of a contact spring.

FIG. 5 shows another embodiment of a contact spring 53, which is made in the form of a slit tube in which two flaps 11 are bent toward the inside, laterally toward the inside relative to the tube. Essentially an elastic force can be created by means of these flaps.

Figure 6:
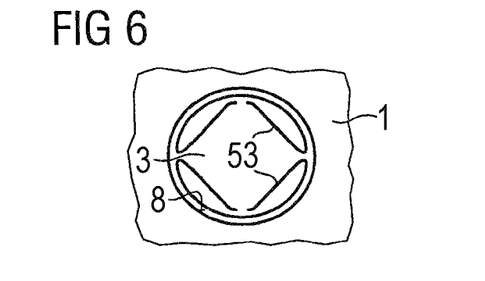
FIG. 6 shows the arrangement of two contact springs in a hole of a body, in accordance with FIG. 5.

FIG. 6 shows how two of the contact springs according to FIG. 5 are arranged in the interior of a circular cavity 3 so as to guarantee a good surface contact with the wall 8 of the cavity 3.

Figure 7:
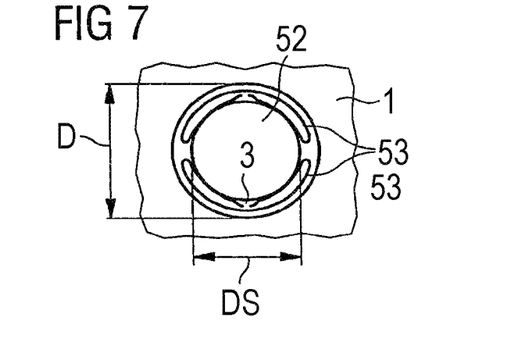
FIG. 7 shows the arrangement from FIG. 6, with an additional connecting part.

FIG. 7 shows another step for the completion of the contact device 5. A connecting part 52 is also inserted in the middle between the two contact springs 53. The flaps of the contact springs 53 are bent toward the outside. Sufficient elastic forces are ultimately generated to create an electrical contact between the connecting part 52 and the contact surfaces located against the wall 8. The elastic forces produced by the contact springs are in principle directed just like they are represented in FIG. 1.

The hole shown in FIG. 7, which forms the cavity 3, is circular in cross section and has a diameter D of approximately 1.2 mm. By insertion of a connecting part 52 in the form of a central rod with an outside diameter DS of 0.6 to 0.8 mm, it is possible to apply a sufficient radially oriented elastic force with the aid of the contact springs 53.

Figure 8:
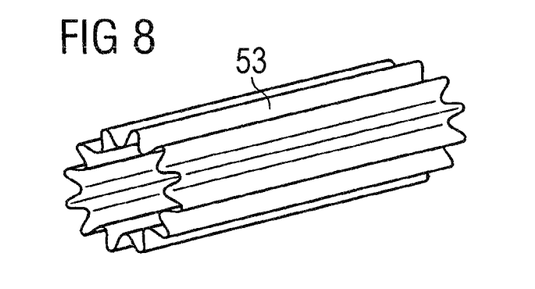
FIG. 8 shows a contact spring, in the form of a corrugated tube.

FIG. 8 shows another embodiment of a contact spring 53 in the form of a selected tube.

It is generally true for the contact springs described here that they may be made of an elastic material, such as beryllium-bronze, copper-bronze, or a similar suitable, electrically conductive material.

The contact springs described here exert radial, elastic forces that act between the wall 8 of the cavity 3 and a connecting part 52 or the contact spring itself.

By the selected surface of the tube in FIG. 8 it is also possible, with a suitable configuration—that is, with a suitable diameter of the hole into which the contact spring 53 is inserted—to produce the creation of radial elastic forces.

Figure 9:
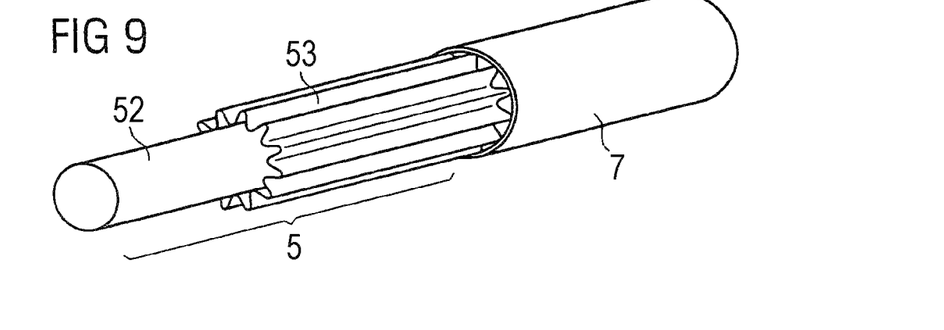
FIG. 9 shows the contact spring from FIG. 8, together with a connecting part and a cover.

For example, this is shown in FIG. 9, where a cover in the form of a tube is shown in accordance with FIG. 3. A contact spring 53 in accordance with FIG. 8 is inserted into this cover. The geometrical ratios are selected such that the selected surface of the contact spring 53 exerts a radial elastic force. For additional contact, a connecting part 52 is inserted, in the form of a conductive metal rod, into the middle area of the contact spring 53.

Figure 10:
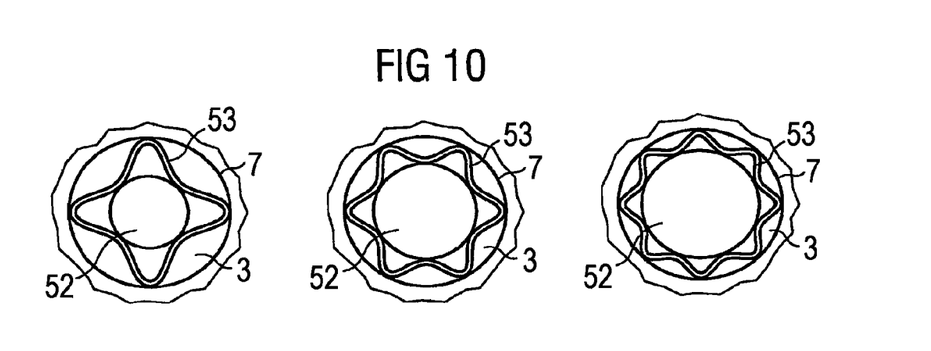
FIG. 10 shows three different embodiments for contact springs in the form of selected tubes, in schematic cross sections.

FIG. 10 shows, in a cross section, three different variants for the development of the contact spring 53 according to the example from FIG. 8. Viewing the representations of FIG. 10 from left to right, the contact spring can be formed, viewed in cross section, according to a four-fold, a six-fold, or also an eight-fold symmetry. In accordance with the shaping of the contact spring 53, the connecting part 52—that is, the central rod from FIG. 9—must, along with the given dimensions of the cover 7, be adapted in its diameter according to the design of the contact spring. The diameter of the connecting part 52 increases from left to right.

Figure 11:
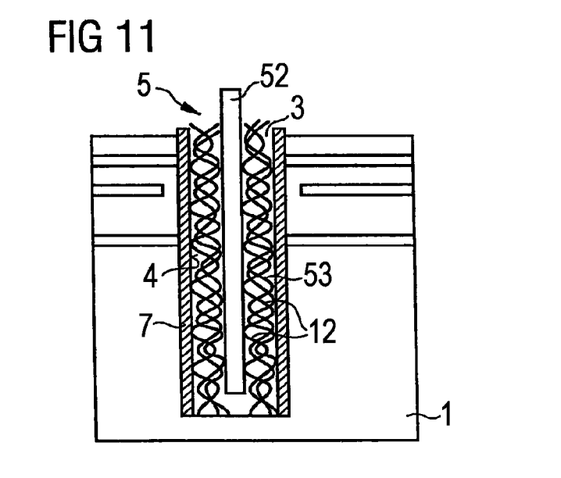
FIG. 11 shows another electrical component in a schematic cross section, wherein a wire mesh is provided as the contact spring.

FIG. 11 shows another embodiment of an electrical component. A wire mesh is provided as the contact spring 53. In accordance with FIGS. 7, 9, and 10, a connecting part 52 in the form of a central rod is again provided in the middle of the cavity 3 for leading the contact out to the outside. Moreover, the structure of the component according to FIG. 11 corresponds to FIG. 2.

The contact spring 53 in the form of a corrugated tube can also be described as a corrugated metal tube.

With the insertion of the contact parts together with the interwoven cords 13, a radially directed elastic force is generated by pressing together the cords 12. The cords 12 or the interwoven cords 12 take over the function of the contact spring 53.

Figure 12:
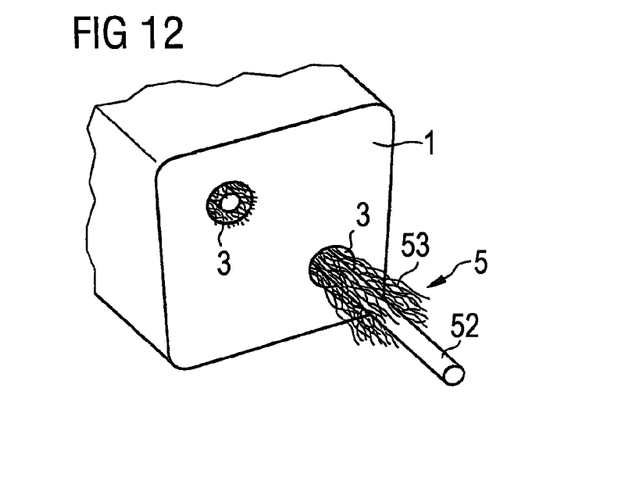
FIG. 12 shows an oblique representation of a component with a wire mesh as a contact spring.

FIG. 12 shows a component in which the contact device is formed in accordance with FIG. 11. The wire mesh that forms the contact spring 53 is made in the form of a braid, as can be seen from FIG. 12, such as is used to shield conductors. FIG. 12 shows two cavities 3. The cord is completely inserted into the first cavity, while in the second cavity it is just in the process of insertion of the contact spring 53 and the connecting part 52 into the cavity 3 which is shown.

The wire mesh described in FIGS. 11 and 12 can be produced by interweaving individual thin cords 12 with one another.

Figure 13:
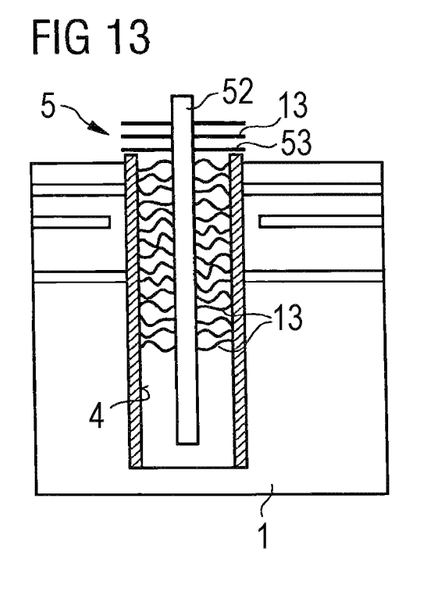

FIG. 13 shows another embodiment of the contact device, in which the contact spring 53 is formed from a large number of small bristles 13 that are fixed to a connecting part 52.

FIG. 13 shows how the bristles 13 fixed on a connecting part 52 are selected in their length such that they must be deformed when inserted into the cavity 13, and thus exert a radially directed elastic force. Thus, this shows that the bristles 13 can assume the function of the contact spring 53. The bristles 13 may be small copper wires, but can also be made of carbon fibers. The connecting part 52 can be produced from wires twisted together with one another, like a bottle brush.

Figure 14:
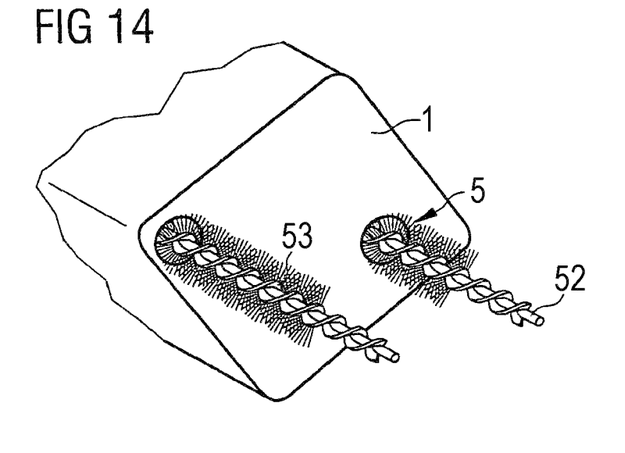

FIG. 14 shows an oblique representation of a piezoelectric component, in which the different poles are contacted through two different cavities by means of an arrangement in accordance with FIG. 13. The left hole in the stack shows the contact device 5 as it is just being inserted into the hole. The right hole in the piezoelectric stack shows the contact device 5 when it is inserted completely into the corresponding hole. Only the connecting part 52 protrudes from the hole. Additional contacting can be effected via connecting part 52.

In all embodiments which are shown in the figures, the elastic force arises through insertion of the contact device 5 into the cavity or hole. In most cases, a central connecting part 52 is provided that is at a distance from the wall 8 of the cavity 3 because of the contact springs 53. By insertion of the connecting part or by the insertion of the connecting part 52 and the contacting spring 53 as a whole, a radially directed elastic force is generated that produces an electrical contact between the connecting part and the contact surface 4 or the inside wall of the cover 7.

The production of an electrical component described here can be carried out, for example, in the following manner. A tube, which may be made of copper or also a copper alloy in the case of a copper-piezoelectric-ceramic tube, is inserted into a cylindrical hole in the green component. The insertion of the tube therefore takes place before sintering of the green component. The green component is produced by stacking on top of one another and laminating ceramic layers that contain a piezoelectric ceramic.

The hole in the green component can be produced, on the one hand, in that punched ceramic green films are stacked on top of one another. The hole, however, can also be produced after production of the green body by boring, on a milling machine, e.g., via a laser or a water jet. Subsequently, the green component is decarbonized and sintered. Sinter shrinkage causes a good mechanical union between the outside wall of the tube and the ceramic material of the component. At the same time, a good electrical union is created between the tube and the electrode layers.

After sintering has taken place, a contact device is used in the cavity in the interior of the tube. This contact device can be constructed in different ways. It should be guaranteed, however, that with a suitable material combination a good electrical contact is assured through the resulting contact force. Furthermore, it should also be assured that the elastic force which produces the electrical contact is maintained even at the typical operating temperatures between 100° and 150° C., or perhaps even 180° C.

It is possible that the tube forming the cover 7 will break during operation. This does not impair the function of the piezoelectric actuator, however, since each segment of the broken tube is reliably contacted by the contact device.

Contacting from the inside, described here, has that advantage that metallization of the inside wall of the cavity or hole can be produced in any wall thickness. A high mechanical strength and a low susceptibility to mechanical wear can also be produced. Furthermore, the cover of the inside wall can also be reprocessed. Thus, a high number of different contacting methods is made possible.

Structural changes and changes in the mechanical characteristics of the tube material and any cracks formed in the tube influence the function of the component thus produced only insubstantially. The adhesion of the tube is very good due to sintering on of the ceramic material, so that it is more probable that the tube will break into individual elements than that it will become detached from the inside wall of the hole.

Elements for the power supply and perhaps also for the production of a mechanical prestress for a piezoelectric component can be introduced into the interior of the tube.

Since these contact or prestressing elements are introduced only after sintering, there is great freedom here regarding the selection of material and the mode of contacting.

What is claimed is:

1. A method of producing an electrical component, comprising:
    forming a stack of ceramic green films, the stack having a hole that is accessible from external to the stack;
    inserting a cover into the hole; and
    sintering the stack together with the cover;
    wherein the hole forms a cavity and the cover forms a contact surface inside the cavity;
    wherein a contact device is inside the cavity and exerts an elastic force on the contact surface; and
    wherein the cover has a coil shape.

2. The method of claim 1, wherein the stack of ceramic green films has piezoelectric properties.

3. The method of claim 1, further comprising:
    electrode layers among ceramic green films in the stack of ceramic green films, wherein the electrode layers comprise a same material as the cover, and wherein sintering produces an electrical contact between the cover and the electrode layers.

4. The method of claim 1, wherein the cover comprises a coil comprising a round wire;
    wherein the coil has a pitch H, an opening A and a width B corresponding to a diameter of the round wire, where $B+A=H$; and
    wherein the stack of green films comprises a length $L0$ before sintering and a length L after sintering, where $B/H=L/L0$.

* * * * *

UNITED STATES PATENT AND TRADEMARK OFFICE
CERTIFICATE OF CORRECTION

PATENT NO. : 8,956,485 B2  Page 1 of 1
APPLICATION NO. : 12/759155
DATED : February 17, 2015
INVENTOR(S) : Heinz Florian, Wolfgang Vogl and Igor Kartashev It is certified that error appears in the above-identified patent and that said Letters Patent is hereby corrected as shown below:

On the Title Page, Item (54) and in the Specification, Column 1; Title

Delete "ELECTRIC FUNCTIONAL UNIT AND METHOD FOR THE PRODUCTION THEREOF"

Insert -- ELECTRICAL COMPONENT AND METHOD FOR THE PRODUCTION THEREOF --

Signed and Sealed this
Thirtieth Day of June, 2015

Michelle K. Lee
*Director of the United States Patent and Trademark Office*